United States Patent [19]

Gallagher

[11] 4,094,733
[45] June 13, 1978

[54] METHOD OF NEUTRALIZING LOCAL DEFECTS IN CHARGE COUPLE DEVICE STRUCTURES

[75] Inventor: Robert C. Gallagher, Ellicott City, Md.

[73] Assignee: Westinghouse Electric Corp., Pittsburgh, Pa.

[21] Appl. No.: 742,315

[22] Filed: Nov. 16, 1976

[51] Int. Cl.² .......................................... H01L 21/306
[52] U.S. Cl. ..................................... 156/648; 148/1.5; 148/186; 156/662; 204/129.1
[58] Field of Search .............. 156/628, 648, 649, 645, 156/662; 29/575, 576 W, 576 T; 148/186, 1.5, 176; 204/129.1

[56] References Cited
U.S. PATENT DOCUMENTS 3,475,661  10/1969  Iwata et al. .................... 148/176

Primary Examiner—David Klein
Assistant Examiner—Jerome W. Massie
Attorney, Agent, or Firm—H. W. Patterson

[57] ABSTRACT

A process and structure are disclosed whereby dopants are used to surround crystalline defects in a semiconductor crystal thereby creating a PN junction which isolates the defect site from the remaining semiconductor substrate and preventing charge flow through the defect into the potential well of a charge coupled device structure.

6 Claims, 6 Drawing Figures

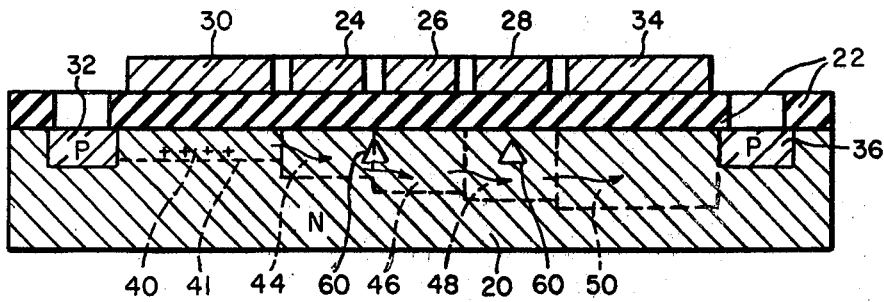

FIG. 1
PRIOR ART

| DIFFUSING A DOPANT OF A SECOND CONDUCTIVITY TYPE INTO A SEMICONDUCTOR SUBSTRATE OF A FIRST CONDUCTIVITY TYPE THEREBY FORMING A FIRST DIFFUSED REGION OF APPROXIMATELY UNIFORM DEPTH AND A SECOND DIFFUSED REGION BETWEEN SAID DEFECT AND THE REMAINDER OF SAID SUBSTRATE |
|---|

↓

| REMOVING SAID FIRST DIFFUSED REGION TO PRODUCE A SUBSTRATE IN WHICH SAID DEFECTS ARE ISOLATED FROM THE REMAINDER OF SAID SUBSTRATE BY SAID SECOND DIFFUSED REGION |
|---|

FIG. 2

METHOD OF NEUTRALIZING LOCAL DEFECTS IN CHARGE COUPLE DEVICE STRUCTURES

BACKGROUND OF THE INVENTION

1. Field of the Invention

This invention relates to a process and structure for neutralizing crystalline defects in a charged coupled device structure, in particular, for isolating the defect from the remaining substrate with a PN junction.

2. Description of the Prior Art

The operation of a charged coupled device, commonly referred to as CCD, basically consists of storing electric charge at the surface of a semiconductor in which a potential well has been created, and moving this charge across the surface of the semiconductor by applying sequentially increasing electric potentials across the semiconductor surface.

By employing a series of metal gates insulated from a silicon substrate by a layer of silicon dioxide, a depletion region is formed under each of the metal gates by applying the appropriate voltage to the appropriate gate electrode. The potential well created by the depletion region under the gate electrode attracts a charge flow into the potential well, and acts as a storage well for the charge packet. By applying a series of sequentially increasing electric pulses to the gate electrodes, the charge packet may be transported into each successive neighboring potential well. The charge packet is thereby progressively transported along an array of gate regions by the sequential application of the appropriate electric pulses.

Although the immediate application of a charge coupled device is to digital electronics, its application may be expanded to analog delay lines whereby the various amounts of charge stored in the potential well are given numeric significance. When the amount of charge stored in the potential well is given numeric significance, crystalline defects in the semiconductor substrate have serious adverse effects on device operation. Defects in the semiconductor substrate, which tend to aggregate near the surface of the semiconductor, interact with the potential well so as to introduce additional charge flow into the potential well. This defect is a region of the semiconductor where the single crystal structure is not maintained and generation-recombination rates are greater than elsewhere in the material. When the defect intersects the potential well, the increased generation-recombination rate causes a flow of carriers into the potential well. This additional charge flow into the potential well increases the amount of charge stored in the charge packet, thereby undesirably altering the analog characteristics of the charge packet. The details of the mechanism by which such additional charge flows into the potential well has received extensive treatment in technical literature. For purposes of simplicity, such mechanisms will not be discussed here.

Neutralizing the effect of the crystalline defect and thereby preventing additional charge flow into the potential well would improve the operating characteristics of the charge coupled device and improve its reliability as an analog delay line.

SUMMARY OF THE INVENTION

The object of the present invention is to neutralize crystalline defects in a semiconductor substrate which enhance additional charge flow into the potential well created by a voltage applied across an insulated gate structure which forms a part of the charge coupled device.

In accordance with the present invention, a process is disclosed for isolating one or more defects in a semiconductor substrate by selectively forming a PN junction between the defect and the remainder of the substrate. In the preferred embodiment, this is performed by diffusing a dopant of second conductivity type into the semiconductor substrate of a first conductivity type, thereby forming a first diffusion region of nearly uniform depth and a second diffussion region between the defect and the remainder of the substrate. The first diffusion region is removed, leaving the second diffusion region to form a PN junction which isolates the defect site from the remainder of the substrate.

Additionally, a charge coupled device with defect sites isolated in accordance with the above described process is disclosed.

BRIEF DESCRIPTION OF THE DRAWINGS

FIG. 1 is a simplified schematic illustration of a cross-section of a charge coupled device with defect sites as constructed using prior art processing;

FIG. 2 is a flow chart summarizing the process steps for neutralizing defect sites in the semiconductor substrate;

DESCRIPTION OF THE PREFERRED EMBODIMENT

Figure 3:
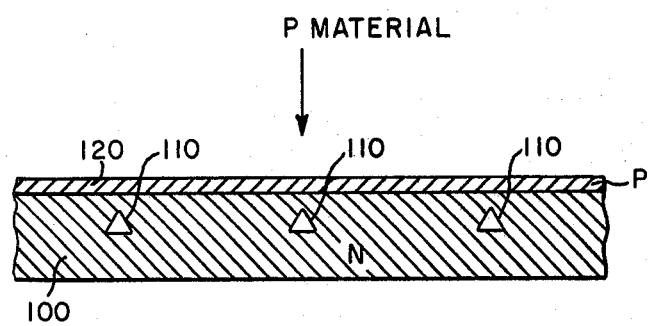
FIGS. 3, 4 and 5 are vertical cross-sectional views schematically illustrating structures resulting from the disclosed process.

FIG. 1 is a simplified schematic vertical cross-sectional view of a charge coupled device as constructed using prior art processing with crystal defects in the semiconductor substrate. The semiconductor substrate 20 is typically silicon, and may be lightly doped with N-type impurities. An insulating layer 22, typically silicon dioxide, is sandwiched between the semiconductor substrate 20 and metal gates 24, 26, 28, 30 and 34. An input gate 30 is adjacent to a source 32 for supplying positive charges consisting of a diffused bed of P-material. A similar output gate 34 is located at the opposite end of the charge coupled device adjacent to a collector 36 for positive charge consisting of a diffused bed of P-material. By applying the appropriate voltage to input gate 30, a potential well 40 is created under the input gate 30 into which positive charges 41 flow. The sequential application of increasing voltage to neighboring gate electrodes 24, 26, 28 and 34 will result in the sequential creation of potential wells 44, 46, 48 and 50 into which the charge packet 41 will preferentially flow. Typical defect sites 60 intersecting or contained within the potential wells 40, 44, 46, 48 and 50 introduce additional charge flow into the potential wells 40, 44, 46, 48 and 50, thereby distorting the charge level within the potential well, and altering the output signal.

FIG. 1 is a simplified charge coupled device illustrating the interaction of defects with the potential wells. In practical devices, a more complicated gate structure may be required. Although only five gates have been shown in FIGS. 1 and 6, additional gates or fewer gates may be used. The gate structure has been simplified because a more complex structure is not required to illustrate this interaction.

FIG. 2 is a flow chart summarizing the process steps which neutralize the effect of a typical defect site 60. A layer of dopant of conductivity type opposite from the conductivity type of the semiconductor substrate is diffused into the semiconductor substrate. A P-doped layer may be formed by depositing a heavily doped glass layer on the surface of an N-type substrate followed by heating the substrate to cause the P-type dopants to diffuse into the substrate. This is a well-known prior art process. Alternatively, ion implantation may be used to implant a shallow layer of P-material in the N-substrate followed by heating the substrate to cause the P-type dopants to diffuse into the substrate. The effect of the diffusion is to create two diffusion regions. The first region is of nearly uniform depth, and the second region located at the defect sites is of slightly greater depth because of the higher diffusion constant at the defect site. If a P-type layer is used, the defect will be surrounded by P-material. Diffusion depths are typically less than 1μm.

The second step in the process is to remove the first diffusion layer, thereby leaving the second diffusion region in the semiconductor substrate. This second diffusion region forms a PN junction with the remaining substrate, thereby isolating the defect. The removal is accomplished by processes known in the art such as chemical etching or anodic oxidation.

Figure 4:
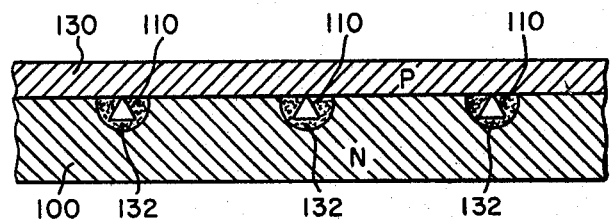
Figure 5:
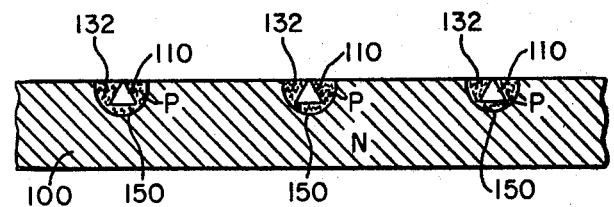

FIGS. 3, 4 and 5 schematically illustrate vertical cross-sectional views of the semiconductor substrate as the processing steps illustrated in FIG. 2 are performed. A semiconductor substrate 100 lightly doped with N-type impurities with defect sites 110 is processed so as to form a P-type layer 120 on the semiconductor substrate 100. Layer 120 may be formed by ion implanting a shallow layer of P-material in the semiconductor substrate 100 using known techniques. A suitable P-type material is boron. Alternatively, the process utilizing a P-doped glass layer previously described may be used to form layer 120. Those skilled in the art will appreciate that other techniques and other P-type materials may be used.

The structure illustrated in FIG. 3 is heated, causing the P-dopants to diffuse further into the substrate 100. This results in two diffusion regions 130 and 132 as illustrated in FIG. 4. The first diffusion region 130 is of nearly uniform depth, and the second diffusion region 132 is of slightly greater depth. The second diffusion region 132 results because of a higher diffusion constant near the defect sites 110.

The first diffusion layer 130 is then removed by techniques known in the prior art, such as chemical etching or anodic oxidation. The resulting structure is schematically illustrated in FIG. 5. The defect sites 110 located in semiconductor substrate 100 isolated from the remaining semiconductor substrate 100 by PN junction 150. The charge coupled device is constructed on semiconductor substrate 100 using conventional techniques.

The effect of the second diffusion region 132 forming a P-well around the defect site 110 is to form a PN junction near the defect. The Fermi level band diagrams of the PN junction without bias as it intersects a potential well in a CCD structure are such that the PN junction forms a barrier which inhibits the flow of charge into the potential well, thereby neutralizing the defects.

Although these process steps illustrated and discussed are for isolating defects in an N-type semiconductor substrate, those skilled in the art will appreciate that similar steps for a P-type semiconductor substrate may be performed by using an N-doped diffusion layer to surround the defect. Such processing steps would result in isolating the defect by a PN junction.

Figure 6:
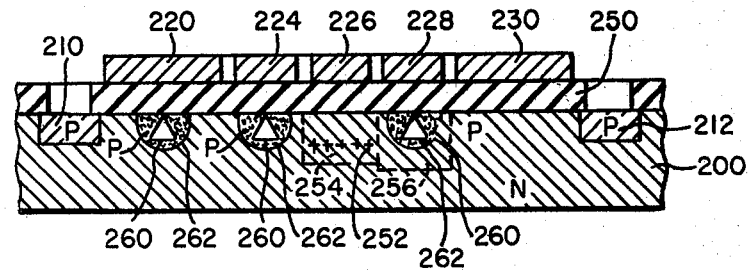
FIG. 6 is a schematic illustration of a charge coupled device with defect sites isolated from the remaining semiconductor substrate by a PN junction.

FIG. 6 is a schematic cross-sectional illustration of a typical charge coupled device with PN junctions isolating the defect from the remainder of the substrate. The device is constructed on an N-type semiconductor substrate 200 with a source of positive charges 210 and a collector for positive charges 212 consisting of two diffused beds of P-material. Metal gates 220, 224, 226, 228, 230 are insulated from the semiconductor substrate 200 by insulating layer 250 which is typically silicon dioxide. Charge packet 252 contained by potential well 254 flows into potential well 256. Typical defect sites 260 are isolated from the remaining semiconductor substrate by PN junction 262, thereby neutralizing their effect on the potential wells 254 and 256.

FIG. 6 is intended to indicate a CCD structure in which the defect sites have been neutralized. In a practical device, a more complicated gate structure may be required to assure efficient transfer of the charge packet to each succeeding potential well.

I claim:

1. A method of preventing charge leakages in potential wells of a charge coupled device which are caused by defects located in a semiconductor substrate in which the potential wells are formed and which defects may intersect the potential wells, the method comprising:

diffusing a dopant of a second conductivity into a semiconductor substrate having a continuous surface to provide a first diffused region of approximately uniform depth and second deeper diffused regions surrounding any defect in said substrate; and removing only said first diffused region from said substrate, said substrate having said second diffused regions surrounding any defects in order to neutralize the effect of any of said defects in the substrate in which the potential wells are to be formed.

2. A method in accordance with claim 1 wherein said doped material of second conductivity is of opposite conductivity type than said semiconductor substrate of first conductivity.

3. A method in accordance with claim 1 further including ion implanting dopants of a second conductivity type in said substrate prior to diffusing said dopants into said substrate.

4. A method in accordance with claim 1 wherein said step of removing said first diffused region is achieved by chemical etching.

5. A method in accordance with claim 1 wherein said step of removing said first diffused region is achieved by anodic oxidation.

6. A method in accordance with claim 1 wherein said dopant is boron.

* * * * *